United States Patent [19]

Simmons, Sr. et al.

[11] Patent Number: 4,641,291

[45] Date of Patent: Feb. 3, 1987

[54] PHASED ARRAY DOPPLER SONAR TRANSDUCER

[75] Inventors: Robert L. Simmons, Sr., San Diego; Clifton M. Wyant, Santee, both of Calif.

[73] Assignee: Ametek, Inc., El Cajon, Calif.

[21] Appl. No.: 702,798

[22] Filed: Feb. 19, 1985

[51] Int. Cl.[4] .......... H04B 1/06; H04B 1/02; H04R 17/00; H01L 41/04

[52] U.S. Cl. .......... 367/157; 367/135; 367/137; 367/168; 310/334; 310/337; 310/26

[58] Field of Search .......... 310/313 R, 326, 334, 310/337, 357, 369, 26; 367/90, 94, 87, 155, 156, 157, 166, 168, 135, 137

[56] References Cited

U.S. PATENT DOCUMENTS

| | | | |
|---|---|---|---|
| 3,992,693 | 11/1976 | Martin et al. | 310/337 X |
| 4,156,158 | 5/1979 | Wilson et al. | 310/369 |
| 4,305,014 | 12/1981 | Borburgh et al. | 310/334 |
| 4,310,957 | 1/1982 | Sachs | 310/334 |
| 4,376,302 | 3/1983 | Miller et al. | 367/157 |
| 4,437,033 | 3/1984 | Diepers | 310/334 |
| 4,518,889 | 5/1985 | Hoen | 310/357 |
| 4,564,980 | 1/1986 | Diepers | 310/334 X |

OTHER PUBLICATIONS

"Doppler Sonar Theory and Practice", by P. A. Gaechter, Sep. 1970, 14 pages (Marquardt).

Atlas–Dolog 10, 6 page brochure on system by Krupp GmbH.

Lean et al., Scanned Magnetostrictive Sensors, IBM Technical Disclosure vol. 17, #12, 5/75, pp 3751–3752.

*Primary Examiner*—Charles T. Jordan
*Assistant Examiner*—Brian S. Steinberger
*Attorney, Agent, or Firm*—Baker, Maxham & Jester

[57] ABSTRACT

A plurality of piezoelectric or magnetostrictive rectangular planar staves are held in side-by-side relation in a laminate assembly including insulative spacers. The widthwise polarity of adjacent pairs of the staves are inverted relative to each other. The acoustic centers of the staves are spaced apart a distance of approximately one-half of a wavelength of the operating frequency. Electrical connections are made to the opposite side edges of each of the staves through leads and bus wires. The array of staves define an active planar acoustic face for simultaneously sending and simultaneously receiving a pair of angularly separated beams of acoustic energy without electronically phasing or time delaying the signals transmitted to and from the individual staves and without mechanically rotating the array.

10 Claims, 11 Drawing Figures

PHASED ARRAY DOPPLER SONAR TRANSDUCER

BACKGROUND OF THE INVENTION

The present invention relates to sonar systems, and more particularly, to a sonar transducer constructed to provide a pair of beams angularly disposed relative to a primary axis without conventional phasing electronics.

In the past, ship mounted sonar systems have existed in which the ocean bottom is used to reflect the sonar energy back to the ship. By measuring the Doppler shift, the true ship's speed over the bottom can be determined. Such systems, sometimes called Doppler Speed Logs, have been utilized for navigation in docking of large ships for some time. They enable measurement of a ship's velocity with respect to the bottom independent of land masses and relay stations, in wind and in all types of weather.

In general, prior art Doppler Speed Log sonar systems have included sonar transducers to send and receive the acoustic energy. These transducers are hull mounted similar to echo sounder transducers. Preamplifiers are needed in the vicinity of the receiving transducer to amplify the weak return signal. Electronic circuitry is required to process the returned signal so that the frequency shift can be determined and a velocity may be computed. A method of display is also required to convert the electrical signal to a visual indication that can be used by the ship's crew.

In order for the motion of a ship to cause a frequency shift in a sonar transmission, the sonar beam must have a directional vector aligned with the motion of the ship. Relatively small trim changes of the ship can cause large apparent velocity changes. To eliminate this sensitivity to trim, a system called the Janus Configuration is used. According to this configuration, grating lobes are generated in the plus and minus thirty degree directions relative to a vertical primary axis. The grating lobes extend fore and aft relative to the longitudinal axis of the ship.

Prior art Doppler Speed Log sonar systems have typically been of the pulse type since continuous wave systems cease to operate when the depth exceeds a predetermined amount, for example, 200 feet. This is because as the water becomes deeper, and the number of scattering particles such as air bubbles increases, the scattered signal begins to dominate over the signal reflected from the bottom.

In one prior art pulse Doppler Speed Log sonar system, commercially manufactured by the Marquardt Company, a two-axis transducer is utilized. This transducer has two separate sending and receiving faces, each aligned at an angle relative to the primary axis for generating the grating lobes in the plus and minus thirty degree directions. The transducer is mounted in a housing on the bottom of the ship which creates a cavity where air bubbles can collect and seriously degrade the accuracy of the system.

Another prior art Doppler Speed Log sonar system called the Atlas-Dolog 10 has been commercially available from Krupp GMBH of Bremen, Germany. In that system, separate transmitter and receiver transducers are utilized. Each consists of a large number (72) of lead-zircon-titanate crystals. Each of the crystals has a flat, cylindrical shape. The crystals are embedded in a block of synthetic material. Complex electronic circuitry including drivers and phase shifters is utilized to generate the sonar beams.

SUMMARY OF THE INVENTION

Accordingly, it is the primary object of the present invention to provide an improved Doppler sonar transducer.

Another object of the present invention is to provide an improved phased array Doppler sonar transducer.

Another object of the present invention is to provide a Doppler sonar transducer which will provide a pair of enhanced grating lobes which are angularly disposed relative to a primary axis.

Another object of the present invention is to provide a sonar transducer for a pulse-type Doppler sonar system in which the necessary phasing is obtained through the structure and geometry of the transducer in order to eliminate phase shifting circuitry.

In the preferred embodiment of our transducer a plurality of piezoelectric or magnetostrictive rectangular planar staves are held in side-by-side relation in a laminate assembly including insulative spacers. The widthwise polarity of adjacent pairs of the staves are inverted relative to each other. The acoustic centers of the staves are spaced apart a distance of approximately one-half of a wavelength of the operating frequency. Electrical connections are made to the opposite side edges of each of the staves through leads and bus wires. The array of staves define an active planar acoustic face for simultaneously sending and simultaneously receiving a pair of angularly separated beams of acoustic energy without electronically phasing or time delaying the signals transmitted to and from the individual staves and without mechanically rotating the array.

DESCRIPTION OF THE PREFERRED EMBODIMENT

Figure 2:
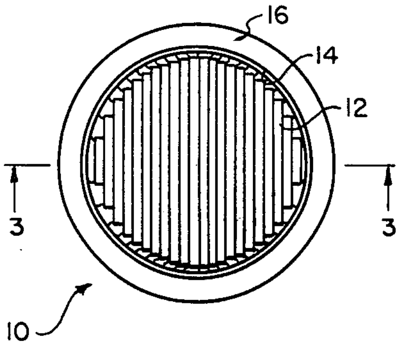
FIG. 2 is a top plan view of the preferred embodiment of our transducer completely assembled.
Figure 3:
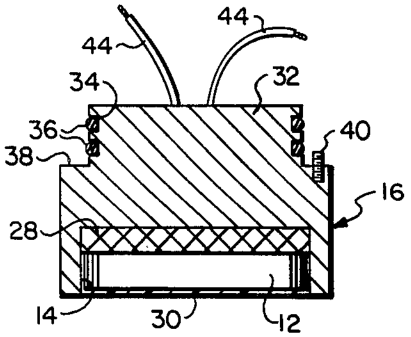
FIG. 3 is a sectional view of the preferred embodiment of our sonar transducer taken along Line 3—3 of FIG. 2.
Figure 4:
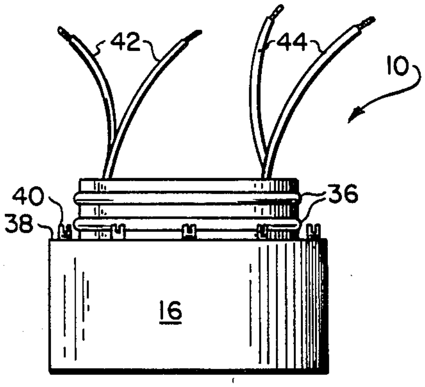
FIG. 4 is a side elevation view of the preferred embodiment of our transducer.

Referring to FIGS. 2, 3 and 4, the preferred embodiment 10 of our sonar transducer includes a generally cylindrical piezoelectric assembly 12 mounted within a cylindrical, outwardly-opening cavity 14 formed in a cylindrical housing 16. By way of example, the housing 16 may be made of brass, aluminum or stainless steel, and may have an outside diameter of approximately 2.75 inches. The transducer 10 is designed to be mounted inside the lower end of a tube which extends through a bulkhead in the bottom of a ship so that the piezoelectric assembly 12 can transmit and receive acoustic signals through the sea water. Thus, the transducer 10 is normally oriented as illustrated in FIG. 3.

Figure 1A:
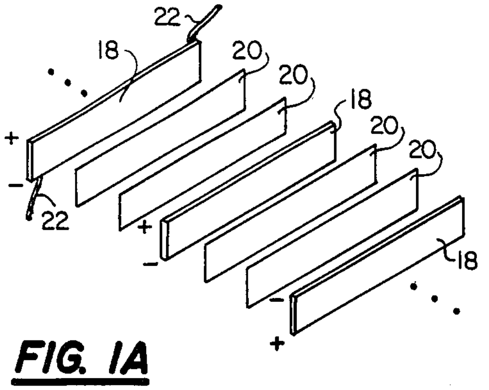
FIG. 1A is an exploded, perspective view illustrating the laminate construction of the preferred embodiment of our sonar transducer which includes ceramic strips separated by insulative spacers.

The construction of the piezoelectric assembly 12 is illustrated in FIG. 1A. A plurality of staves in the form thin, rectangular ceramic strips 18 are each separated by a pair of insulating spacer elements in the form thin, rectangular MYLAR sheets 20. The ceramic strips are preferably made of lead-zircon-titanate material. The strips 18 could also be made of a magnetostrictive material. The proper operation of the piezoelectric assembly 12 depends upon the ceramic strips 18 being mechanically decoupled from one another. Each pair of immediately adjacent MYLAR sheets are bonded with suitable adhesive to corresponding ones of the ceramic strips, but not to each other. Thus, each ceramic strip can expand and contract independent of the adjacent ceramic strips. The ceramic strips are polarized across their widths as indicated by the plus and minus signs in FIG. 1A. The top and bottom longitudinal side edges of each of the ceramic strips are preferably coated with a layer of silver so that individual wire leads 22 (FIG. 1A) may be soldered thereto.

Figure 1B:
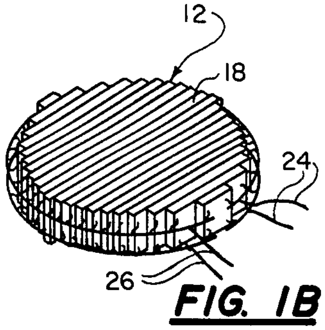
FIG. 1B is a perspective view of the assembled laminate construction of the preferred embodiment of our sonar transducer and further illustrating the wiring utilized to connect the ceramic strips.

In the preferred embodiment of our transducer, there are approximately forty staves or ceramic strips 18. The lengths of the ceramic strips are progressively dimensioned so that when the ceramic strips and MYLAR spacers are sandwiched together as illustrated in FIG. 1B, they form a generally cylindrical flat disk which can fit into the cylindrical cavity 14 of the housing 16. By way of example, the MYLAR sheets 20 (FIG. 1A) may each have a thickness of approximately 0.002 inches, and the ceramic strips may have a width of approximately one-half inch, a thickness of approximately one-sixteenth of an inch, and a length depending upon the position within the circular laminate assembly. By way of example, the longest ceramic strip 18 which extends diametrically across the cavity 14 of the housing 16 may have a length of approximately 2.001 inches.

Figure 8:
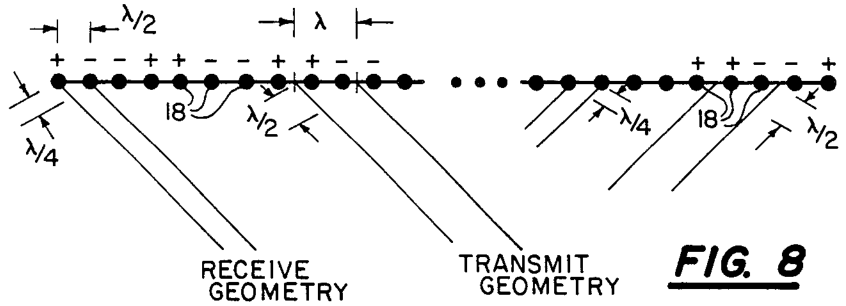
FIG. 8 is a diagrammatic illustration of the unique geometry of our sonar transducer.
Figure 10:
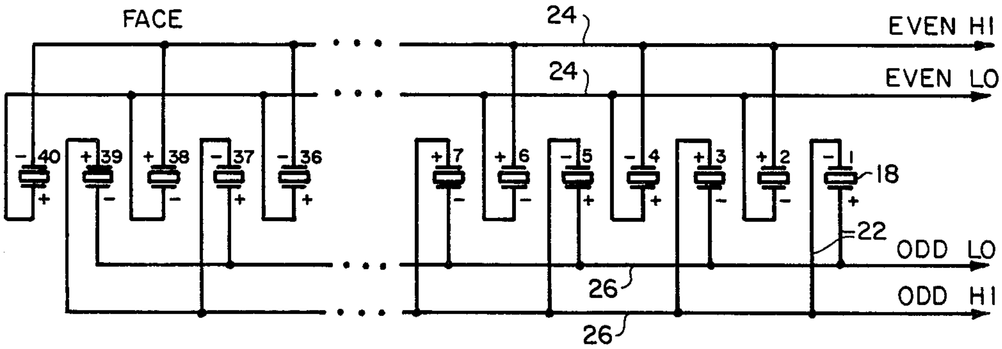
FIG. 10 is a schematic diagram illustrating the wiring of the ceramic strips in the preferred embodiment of our sonar transducer.

As explained hereafter in greater detail, the desired phasing is obtained by an array geometry with 180 degrees phase shift which is derived by inverting the staves or ceramic strips 18 by pairs as illustrated in FIG. 8. FIG. 10 illustrates the manner in which the leads 22 connected to the inverted pairs of ceramic strips are connected to a pair of even bus wires 24 and a pair of odd bus wires 26. This wiring is also illustrated in FIG. 1B. Referring to FIG. 1A, the leftmost ceramic strip 18 is shown inverted with respect to the right pair of ceramic strips 18. In other words, the positive longitudinal side edge of the right-most ceramic strip 18 is facing downwards in FIG. 1A whereas the positive longitudinal side edges of the left two ceramic strips in FIG. 1A are facing upwardly.

The piezoelectric assembly 12 (FIG. 1B) has its rearward face bonded by adhesive to a cylindrical pressure release pad 28 (FIG. 3). In the preferred embodiment of our sonar transducer, the pressure release pad 28 is made of a composite of cork and neoprene. The pressure release pad in turn rests upon the bottom wall of the cavity in the housing 16. The piezoelectric assembly 12 is potted within the cavity by a quantity of a resilient, insulative material such as polyurethane. A layer 30 of a resilient, insulative material, such as polyurethane, covers the face of the piezoelectric assembly 12 and provides an acoustic window. This layer 30 also provides a watertight seal.

Figure 5:
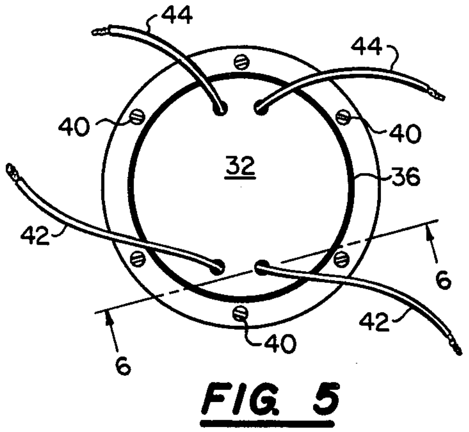
FIG. 5 is a bottom plan view of the preferred embodiment of our sonar transducer.

The rearward end of the housing 16 has a reduced diameter portion 32 (FIG. 3) formed with a pair of annular grooves 34 in its outer surface. Resilient O-rings 36 are seated in the annular grooves for providing a watertight seal between the housing portion 32 and the inside walls of the lower end of the tube (not illustrated) within which the transducer is mounted. Screws 40 (FIGS. 3 and 5) may be threaded into circumferentially spaced holes in the shoulder 38 of the housing to secure the transducer to the tube.

Figure 6:
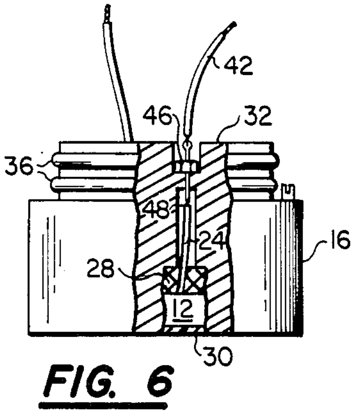
FIG. 6 is a side elevation view of the preferred embodiment of our transducer with a portion cut away along line 6—6 of FIG. 5 and illustrating details of one of the electrical connectors.

Wires 42 and 44 (FIG. 5) are electrically connected to the bus wires 24 and 26 (FIGS. 1B and 10) surrounding the piezoelectric assembly 12. As illustrated in FIG. 6, electrical connectors such as 46 are mounted in elongate holes such as 48 which extend through the reduced diameter portion 32 of the housing. In FIG. 6, one of the wires 44 is connected to one of the bus wires 24.

Figure 7:
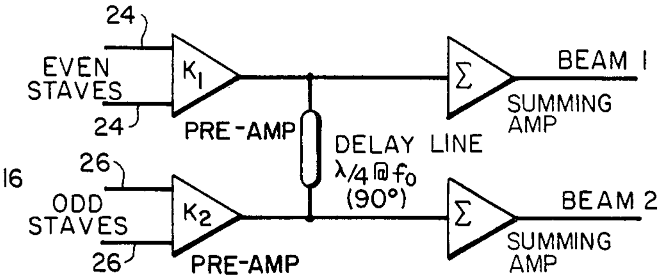
FIG. 7 is a schematic diagram of the quadrature beamformer which may be utilized with the preferred embodiment of sonar transducer.
Figure 9:
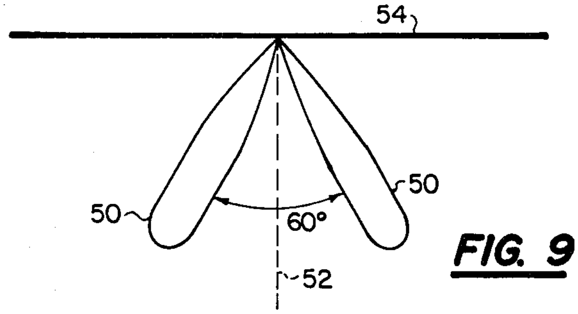
FIG. 9 illustrates the grating lobes generated by our sonar transducer.

Our transducer utilizes a unique geometry of a multiplicity of staves to provide enhanced grating lobes 50 (FIG. 9) in the directions plus and minus thirty degrees relative to the primary axis 52 extending perpendicular with respect to the longitudinal axis of the ship represented by the line 54. Complex phasing electronics are not required for phasing or time delaying the signals. Nor is is necessary to mechanically steer or rotate the transducer to obtain the angularly separated beam pattern. Preferably the axis of each beam so extends at an angle of between thirty and forty-five degrees from the primary axis 52. As illustrated in FIGS. 8 and 10, the polarity of adjacent pairs of staves are inverted or opposite with respect to each other provide a 180 degree phase shift. Beamforming is performed in both the transmit and receive modes through the unique geometry. Symmetry results in simultaneous beams which are separated in the receive mode using a quadrature beamformer such as that illustrated in FIG. 7. As illustrated in FIG. 8, the centers of each stave are preferably spaced apart approximately one-half the distance of the wave length at the operating frequency, which is preferably at least 300 kilohertz. Therefore, the center lines of adjacent pairs of oppositely oriented staves are spaced apart a distance of approximately one full wave length at the operating frequency. The primary axis radiation is reduced to substantially zero. As with any phased array, the Doppler constant, with respect to horizontal velocity, is independent of the speed of sound in the medium.

A theoretical analysis of our transducer is set forth hereafter.

Transmit Geometry $$E = e \cos \omega t$$

Pressure wave normal to the MRA:

$$I_T = \tfrac{1}{2}\left\{ \sum_{1}^{n/2} (j)(-i_o \cos \omega t) + (-j)(i_o) \cos \omega t \right\}$$

$$I_T = \tfrac{1}{2}\left\{ 2\left(\frac{n}{2}\right) - j\, i_o \cos \omega t \right\}$$

Where $i_o$ is acoustic intensity and ½ indicates symmetry and each beam intensity is down 6 dB relative to the unphased configuration.

Since the array is equally weighed with inphase and inverted staves, the net direct radiation is zero.

Receive Geometry

Odd staves receive an acoustic intensity of $i_o \cos \omega t$ with phase delays which are multiples of 180° (λ/2).

$$\Sigma\,\text{Odd} = \sum_{o\,1}^{n/2} i_o \cos \omega t$$

Even staves receive with 90° (λ/4) relative phase $$\Sigma\,\text{Even} = \sum_{e\,1}^{n/2} -j\, i_o \cos \omega t$$

The desired beam is $$-j \sum_{o\,1}^{n/2} + \sum_{o\,1}^{n/2} = \sum_{o\,1}^{N/2} (-j)(i_o) \cos \omega t + \sum_{e\,1}^{n/2} -j\, i_o \cos \omega t$$

$$-j \sum_{o\,1}^{n/2} + \sum_{e\,1}^{n/2} = (-j)\, 2(n/2)\, i_o \cos \omega t$$

$$e_o = 2\Sigma i \cos \omega t$$
$$= -j\, n i_o \cos \omega t$$

The suppressed beam is:

$$\sum_{o\,1}^{n/2} + -j \sum_{e\,1}^{n/2} = \sum_{o\,1}^{n/2} i_o \cos \omega t + (-j) \sum_{e\,1}^{n/2} -j\, i_o \cos \omega t$$

$$= \sum_{1}^{n/2} i_o \cos \omega t + \sum_{1}^{n/2} -i_o \cos \omega t$$

$$= 2(n/2)\,(0) = 0$$

The acoustic centers of the staves have the spacings illustrated in FIG. 8. In operation, while some of the staves are contracting widthwise, others are expanding widthwise since they are out of phase. Widthwise refers to up and down in FIG. 3.

The flat face or surface of our transducer is advantageous. It permits the face of the transducer to be flush mounted with respect to the surface of the hull or other mounting structure. Flow noise is reduced and accuracy is increased. In the transmit mode, the odd and even staves are all driven at the same time. In the receive mode, signals on the bus wires 24 and 26 are fed to the quadrature beamformer of FIG. 7 for separating of the two beams.

Having described a preferred embodiment of our phased array Doppler sonar transducer, it will be apparent to those skilled in the art that our invention may be modified in both arrangement and detail. Therefore, the protection afforded our invention should only be limited in accordance with the scope of the following claims.

We claim:

1. An underwater transducer, comprising:

a plurality of rectangular planar staves made of a material selected from the group consisting of piezoelectric material and magnetostrictive material, each stave being polarized across its width and having positive and negative longitudinal side edges;

means for supporting the staves in parallel relationship with one longitudinal side edge of each stave extending in a common plane defining an active face, the staves being mechanically decoupled so that they can freely expand and contract across their widths independent of each other, and the staves being oriented such that every other adjacent pair of longitudinal side edges in the active face are positive and the interspersed adjacent pairs of longitudinal side edges in the active face are negative;

means for providing electrical connection to the positive and negative longitudinal side edges of each of the staves, including first and second even buses and first and second odd busses, the positive and negative longitudinal side edges of every other stave being connected to the first and second even busses, respectively, and the positive and negative side edges of the interspersed staves being connected to the first and second odd busses, respectively; and an acoustic center of each longitudinal side edge in the active face being spaced a distance of approximately one-half wavelength of a predetermined operating frequency apart from and acoustic center of an immediately adjacent longitudinal side edge in the active face.

2. A transducer according to claim 1, wherein the supporting means includes:

a plurality of rectangular planar insulative elements interspersed between the staves in parallel relationship therewith.

3. A transducer according to claim 1 wherein the staves have progressive lengths so that together they form a generally cylindrical flat disk.

4. A transducer according to claim 1 wherein the supporting means includes a resilient pressure release pad supporting a rearward face defined by the longitudinal side edges of the staves opposite the active face.

5. A transducer according to claim 1 and further comprising a resilient window covering the active face.

6. A transducer according to claim 1 wherein the predetermined frequency is at least 300 kilohertz.

7. A transducer according to claim 1 wherein the staves are made of a lead-zircon-titanate piezoelectric material.

8. A transducer according to claim 2 wherein there are two planar insulative elements between each stave, each bonded to a corresponding stave but not to each other.

9. A transducer according to claim 3 wherein the supporting means includes a cylindrical housing having an outwardly-opening cavity in which the disk is mounted.

10. A transducer according to claim 9 wherein a resilient pressure release pad is mounted in the cavity between a bottom wall of the cavity and a rearward face of the disk defined by the longitudinal side edges of the staves opposite the active face, the disk is potted within the cavity by a quantity of a resilient insulative material, and a layer of the resilient insulative material covers the active face of the disk to provide an acoustic window and a watertight seal.

* * * * *